United States Patent
Aoki et al.

(10) Patent No.: US 7,649,411 B2
(45) Date of Patent: Jan. 19, 2010

(54) SEGMENTED POWER AMPLIFIER

(75) Inventors: Ichiro Aoki, San Clemente, CA (US);
Scott Kee, Dana Point, CA (US);
Seyed-Ali Hajimiri, Pasadena, CA (US);
Roberto Aparicio Joo, Newport Beach, CA (US); Rahul Magoon, Irvine, CA (US); Donald McClymont, Dana Point, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 50 days.

(21) Appl. No.: 11/827,186

(22) Filed: Jul. 11, 2007

(65) Prior Publication Data
US 2009/0015336 A1    Jan. 15, 2009

(51) Int. Cl.
*H03F 1/14*    (2006.01)
(52) U.S. Cl. ............... 330/51; 330/124 R; 330/124 D; 330/295
(58) Field of Classification Search .......... 330/51, 330/124 R, 124 D, 295
See application file for complete search history.

(56) References Cited

U.S. PATENT DOCUMENTS

| | | | |
|---|---|---|---|
| 3,449,685 A | 6/1969 | Holmes | |
| 5,872,481 A * | 2/1999 | Sevic et al. | 330/51 |
| 5,926,068 A | 7/1999 | Harr | |
| 6,320,913 B1 * | 11/2001 | Nakayama | 375/297 |
| 6,400,227 B1 * | 6/2002 | Goldfarb et al. | 330/295 |
| 6,445,248 B1 | 9/2002 | Gilbert | |
| 6,498,534 B1 * | 12/2002 | Kim et al. | 330/136 |
| 6,812,771 B1 | 11/2004 | Behel et al. | |
| 7,274,253 B2 * | 9/2007 | Pan | 330/51 |

FOREIGN PATENT DOCUMENTS

| | | |
|---|---|---|
| WO | 97/22177 | 6/1997 |
| WO | 01/06644 | 1/2001 |

OTHER PUBLICATIONS

PCT International Search Report and Written Opinion for corresponding case PCT/US2008/069623, mailed Mar. 20, 2009, 17 pgs.

\* cited by examiner

*Primary Examiner*—Patricia Nguyen
(74) *Attorney, Agent, or Firm*—Jackson Walker L.L.P.; Christopher J. Rourk

(57) ABSTRACT

A system for amplifying a signal is provided. The system includes a plurality of driver stages, each having an input, an output, and a disable control. An output stage having an input is coupled to the outputs of the plurality of driver stages. A plurality of disable control signals is provided to the driver stages so as to controllably enable and disable one or more of the driver stages.

25 Claims, 5 Drawing Sheets

SEGMENTED POWER AMPLIFIER

FIELD OF THE INVENTION

The present invention relates to power amplifiers, and more particularly to a segmented power amplifier and method of operation that allows one or more of a plurality of driver stages or one or more of a plurality of output stages to be selectively disabled.

BACKGROUND OF THE INVENTION

Power amplifiers are known in the art. One application of power amplifiers is the use of a variable gain power amplifier to produce amplitude modulation in an AM transmitter or in a polar transmitter. In these configurations, a power amplifier can be required to change its output level over a wide range. Depending on the system requirements, the amplifier may be required to produce an accurate output level or an accurate gain between input amplitude and output amplitude. An amplifier may be required to keep a nearly constant phase offset between input signal and output signal. It may also be desirable for an amplifier to have capability to be power efficient at all output levels.

FIG. 1 is a diagram of a typical prior art variable gain amplifier 100, such as might be used in a polar transmitter or AM transmitter. Amplifier 100 includes output stage 102 and driver stage 101. Output stage 102 produces a controlled gain or a controlled output level, such as by using control circuit 103. An RF input signal is provided to an input of driver stage 101, which produces an output signal that is provided to an input of output stage 102, which produces output signal 104. By controlling the gain of output stage 102, the amplitude of output signal 104 can be controlled.

When a coupling 105 exists between the input and output of output stage 102 which is independent of the controlled gain, such as a capacitance of a transistor used to implement output stage 102, metallization capacitance, capacitance due to some other circuit used in conjunction with output stage 102, or other typical capacitances or couplings, undesired system behavior can occur. One common cause of this coupling is gate-drain or base-collector capacitance in an amplifying transistor used to implement output stage 102. Other detrimental couplings 105 from input to output can also occur, such as resistive coupling, inductive couplings, or series and/or parallel combinations of such couplings.

FIG. 2 is a diagram 200 showing an exemplary output amplitude response of prior art variable gain power amplifier 100 containing a coupling 105 across the variable gain output stage. Waveform 201 depicts the output amplitude of output signal 104 of output stage 102 versus the control applied to the output stage. Waveform 202 depicts a desired response of output amplitude versus control applied to output stage 102. The desired response may be linear over a wide range of control, including at small amplitudes. Waveform 201 of amplifier 100 can be linear over a range 204 of relatively large amplitudes. At lower amplitudes, coupling 105 can cause waveform 201 to deviate from the desired response. Coupling 105 can cause the amplifier to produce an output amplitude 203 even when the desired response from the control is to have zero amplitude. This can occur if output stage 102 is producing no gain for this control, while output amplitude 203 is caused by coupling 105. In this case, it can be impossible to control output stage 102 to produce an amplitude of output signal 104 that is lower than output amplitude 203.

FIG. 3 is a diagram 300 showing an exemplary output phase response of prior art variable gain power amplifier 100 containing a coupling 105 across the variable gain output stage. Waveform 301 depicts the output phase of output signal 104 of output stage 102 versus the control applied to the output stage. Waveform 302 depicts a desired response of output phase versus control applied to output stage 102. The desired response may be for a constant output phase over a wide range of control, including at small amplitudes. Waveform 301 of amplifier 100 can be nearly constant over a range 304 of relatively large amplitudes. At lower amplitudes, coupling 105 can cause waveform 301 to deviate from the desired response. This deviation can occur if the component of the output signal due to coupling 105 has a different phase than the desired output signal due to output stage 102. For output amplitudes where the signal component due to coupling 105 is comparable or greater in magnitude than the signal component due to output stage 102, the phase of output signal 104 can move away from the desired response towards the phase of the leakage signal 303.

FIG. 4 is a diagram 400 showing an exemplary power consumption of prior art variable gain power amplifier 100. Waveform 401 depicts the power consumption of output stage 102 versus the control signal applied to output stage 102. The power consumption of output stage 102 can vary with the control signal, typically increasing as the gain or output amplitude increases. Waveform 402 depicts the power consumption of driver stage 101. At low gains or output amplitudes, the power consumption due to the driver stage can be comparable to or even greater than the power consumption due to output stage 102. At sufficiently low output amplitudes, the signal at the output of driver stage 101 may be stronger than output signal 104, so that the driver amplifier can be amplifying the signal only to have output stage 102 attenuate it to a lower level.

SUMMARY OF THE INVENTION

Therefore a segmented power amplifier is provided that provides improved amplitude response at low gains or output levels.

In particular, a segmented power amplifier is provided that provides improved phase response at low gains or output levels, and reduced power consumption at low gains or output levels.

In accordance with an exemplary embodiment of the present invention, a system for amplifying a signal is provided. The system includes a plurality of driver stages, each having an input, an output, and a disable control. An output stage having an input is coupled to the outputs of the plurality of driver stages. A plurality of disable control signals is provided to the driver stages so as to controllably enable and disable one or more of the driver stages.

The present invention provides many important technical advantages. One important technical advantage of the present invention is a segmented power amplifier and method of operation that allows one or more of a plurality of driver stages to be disabled, so as to control the amount of power used to amplify an RF signal that is provided to an output stage in a manner that reduces power consumption by turning off driver stages that are not required.

Those skilled in the art will further appreciate the advantages and superior features of the invention together with

DETAILED DESCRIPTION OF PREFERRED EMBODIMENTS

Figure 1:
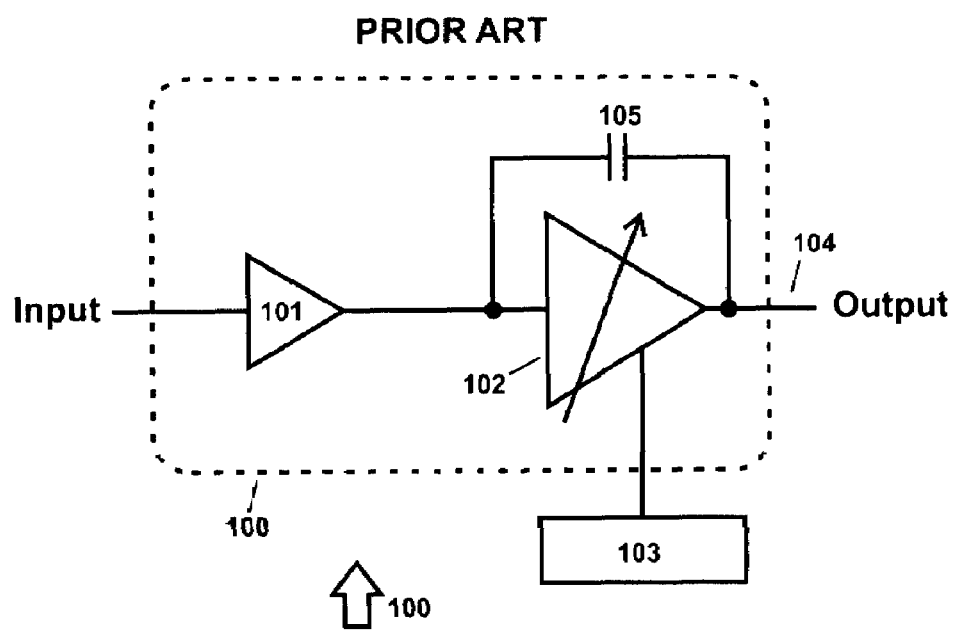
FIG. 1 is a diagram of a typical prior art variable gain amplifier, such as might be used in a polar transmitter or AM transmitter.
Figure 2:
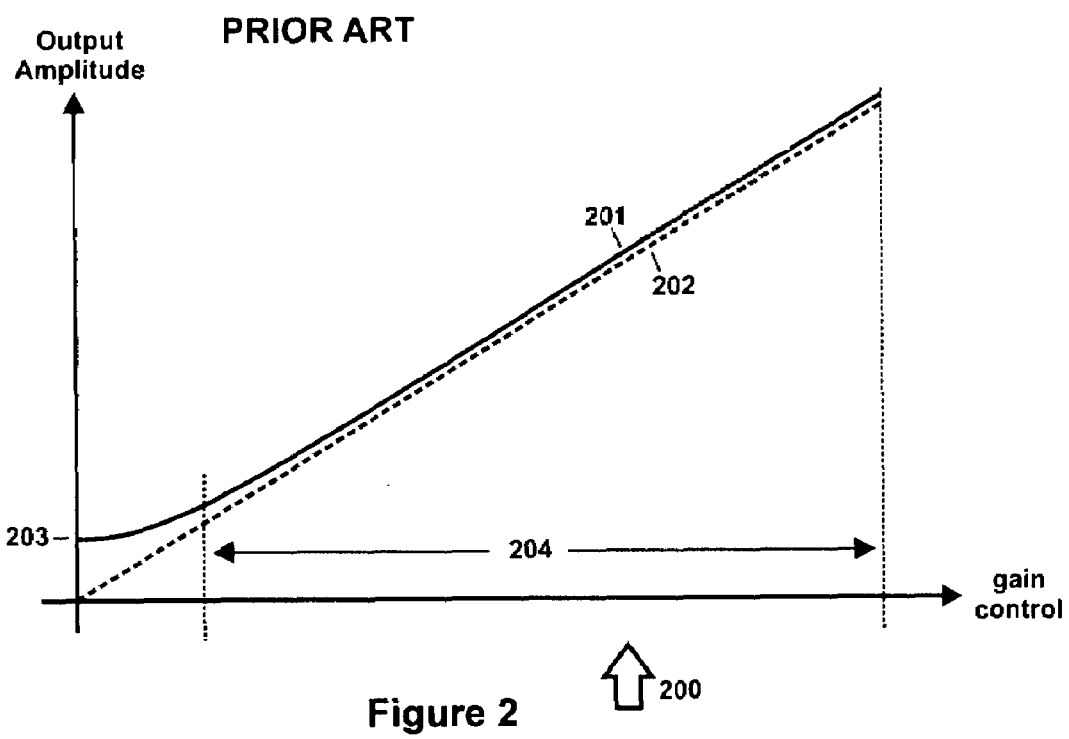
FIG. 2 is a diagram showing an exemplary output amplitude response of a prior art variable gain power amplifier containing a coupling across the variable gain output stage.
Figure 3:
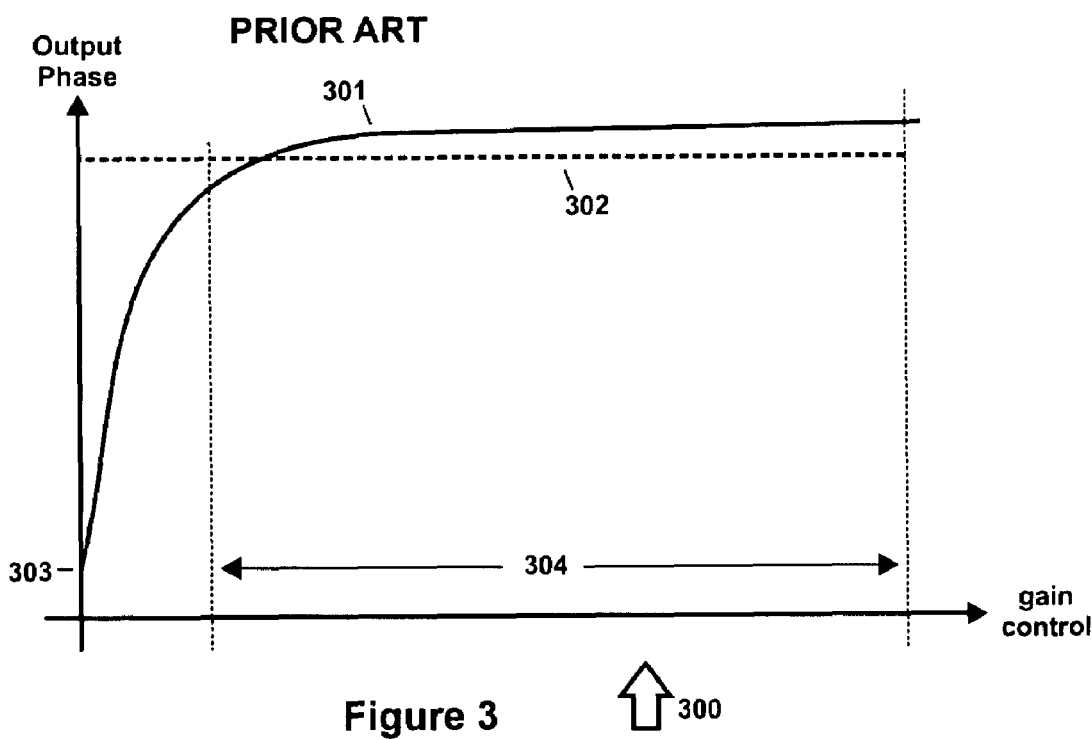
FIG. 3 is a diagram showing an exemplary output phase response of a prior art variable gain power amplifier containing a coupling across the variable gain output stage.
Figure 4:
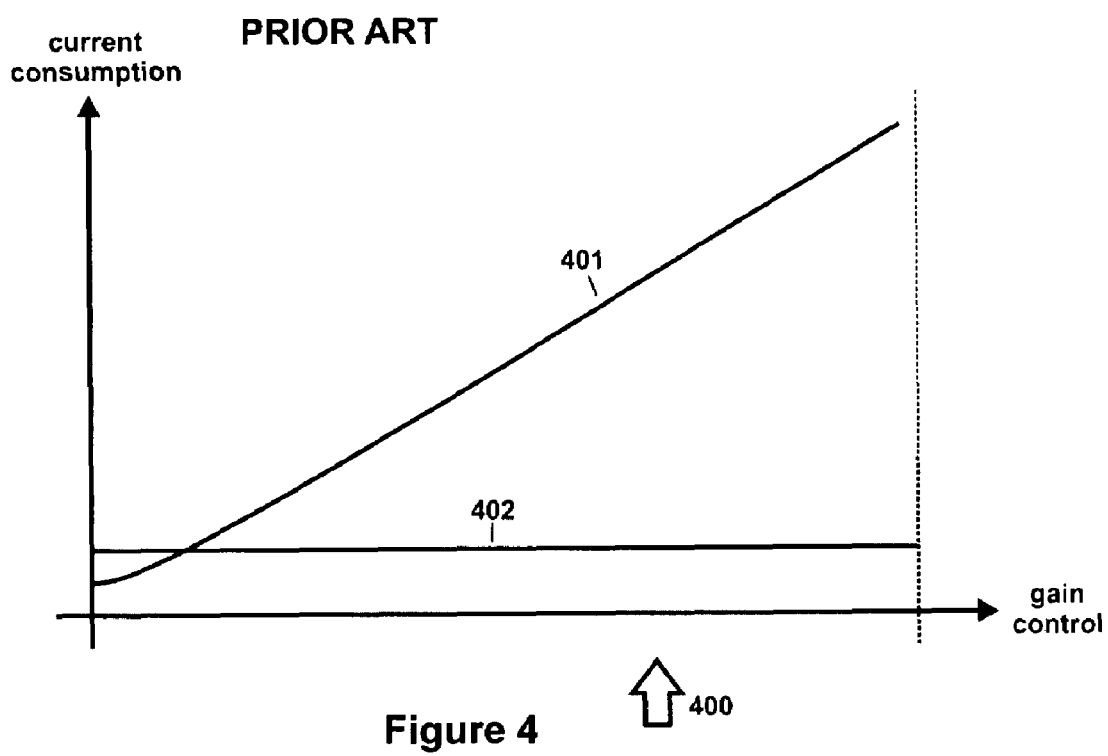
FIG. 4 is a diagram showing an exemplary power consumption of a prior art variable gain power amplifier.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

Figure 5:
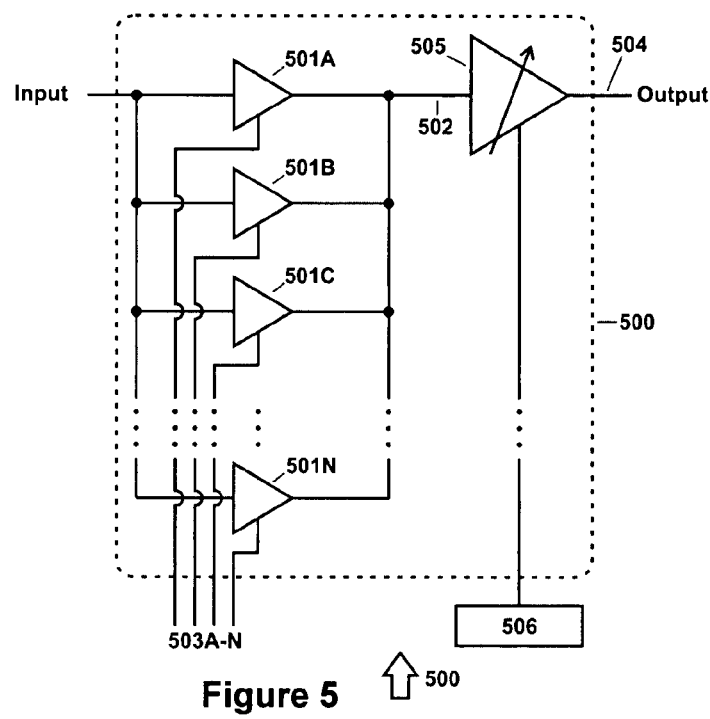
FIG. 5 is a diagram of a power amplifier in accordance with an exemplary embodiment of the present invention.

FIG. 5 is a diagram of segmented power amplifier 500 in accordance with an exemplary embodiment of the present invention. Segmented power amplifier 500 and the other exemplary embodiments of inventive segmented power amplifiers disclosed herein can be used in a transmitter, transceiver, computer, consumer electronic device, automotive system, aviation system, or in other suitable applications where an RF signal requires amplification.

Segmented power amplifier 500 includes output stage 505 and a plurality of driver stages 501A through 501N. Each of driver stages 501A through 501N receives an RF input as an input from which it can drive a common output 502. Output stage 505 receives common output 502 from which it can generate output signal 504, which can be used as an output of segmented power amplifier 500. In one exemplary embodiment, the gain or output amplitude of output stage 505 can be adjusted using control circuit 506. In another exemplary embodiment, control circuit 506 can also be used to generate selection signals 503A-N. In another exemplary embodiment, output stage 505 can be a fixed gain amplifier.

One or more of driver stages 501A through 501N can be selectively disabled using selection signals 503A through 503N. Selection signals 503A through 503N can be individual binary selection signals that are provided to each of driver stages 501A through 501N, so as to allow each driver stage to be selectively disabled. Other suitable selection signals can also or alternatively be used. One or more of driver stages 501A through 501N can be disabled, such as when the output level or gain is sufficiently low, to reduce current consumption in the driver amplifiers which have been disabled. In one exemplary embodiment, disabling one or more of driver stages 501A through 501N can reduce the amplitude of common output 502, thereby reducing a leakage signal of output signal 504 from a coupling between common output 502 and output signal 504 and providing the benefit of reduced amplitude and phase distortion at low output signal amplitudes if output stage 505 is configured to provide variable gain, such as in an AM transmission or polar transmission system.

In one exemplary embodiment, driver stages 501A through 501N can be configured to have binary weighted strengths. This can be accomplished by using binary weightings on device sizes used in the several amplifiers such that the smallest driver stage 501A has a given device size or rating, the second smallest driver stage 501B has twice the device size or rating, the third smallest driver stage 501C has four times the device size or rating, and so forth. In this exemplary embodiment, driver stages 501A through 501N can be adjusted to provide a controllable system performance over a wide range of output signal levels while using the smallest required number of driver stages 501A through 501N and selection signals 503A through 503N. Other logarithmic, pseudo-logarithmic, adjustable gain weighting, or other suitable weighting architectures can also or alternatively be used.

Figure 6:
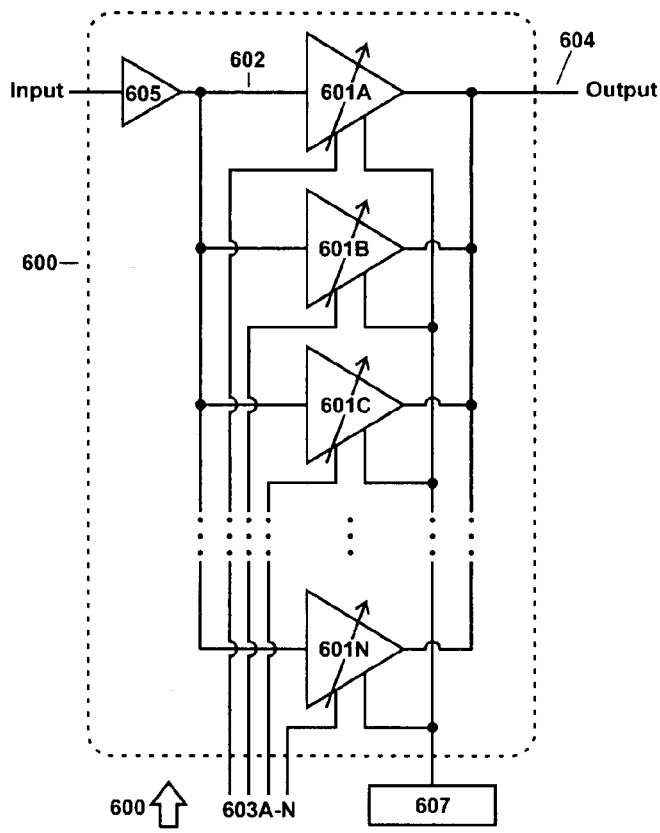
FIG. 6 is a diagram of a power amplifier in accordance with an exemplary embodiment of the present invention.

FIG. 6 is a diagram of power amplifier 600 in accordance with an exemplary embodiment of the present invention. Power amplifier 600 includes driver amplifier 605 and a plurality of output stages 601A through 601N. Driver amplifier 605 receives an input RF signal from which it produces intermediate signal 602. Each of the output stages 601A through 601N receives intermediate signal 602 as an input from which it can drive a common output 604. Common output 604 can be used as an output of power amplifier 600. In one exemplary embodiment, the gain or output amplitude of each of output stages 601A through 601N can be adjusted using control circuit 607, such that each output stage 601A through 601N has the same adjusted gain, a different adjusted gain, some output stages 601A through 601N have the same adjusted gain and other output stages 601A through 601N have a different adjusted gain, or other suitable gain settings can also or alternatively be used. For example, two of output stages 601A through 601N could have a first adjusted gain, and each of the remaining output stages 601A through 601N could each have a different adjusted gain. Likewise, two of output stages 601A through 601N could have a first adjusted gain, two additional output stages 601A through 601N could have a second adjusted gain, and each of the remaining output stages 601A through 601N could each have a different adjusted gain. Other suitable combinations of gain settings can also or alternatively be provided. In another exemplary embodiment, output stages 601A through 601N can each be a fixed gain amplifier, or other suitable embodiments can be used. In another exemplary embodiment, control circuit 607 can also generate selection signals 603A through 603N, or the selection signals 603A through 603N can be used to disable one or more of output stages 601A through 601N by setting their gain to zero.

One or more of output stages 601A through 601N can be selectively disabled using selection signals 603A through 603N. Selection signals 603A through 603N can be individual binary selection signals that allow each of output stages 601A through 601N to be selectively disabled, or other suitable selection signals. One or more of output stages 601A through 601N can be disabled, such as when the output level or gain is sufficiently low, so as to reduce current consumption in the output stages which have been disabled. In some cases, disabling one or more of output stages 601A through 601N can reduce the amount of coupling between intermediate signal 602 and common output 604, thereby reducing a leakage signal at common output 604 from a coupling between intermediate signal 602 and common output 604. Disabling one or more of output stages 601A through 601N can also reduce amplitude and phase distortion at low output signal amplitudes if output stages 601A through 601N are configured to provide variable gain, such as in an AM transmission or polar transmission system.

In another exemplary embodiment, output stages 601A through 601N can be configured to have binary weighted strengths. This can be accomplished by using binary weightings on device sizes used in the several amplifiers such that in the smallest output stage 601A has a given device size or rating, the second smallest output stage 601B has twice the device size or rating, the third smallest output stage 601C has four times the device size or rating, and so forth. In this exemplary embodiment, driver stages 601A through 601N can be adjusted for optimal performance over a wide range of output signal levels while using the smallest required number of driver stages 601A through 601N and selection signals 603A through 603N. Other logarithmic, pseudo-logarithmic, or other suitable weightings can also or alternatively be used.

Figure 7:
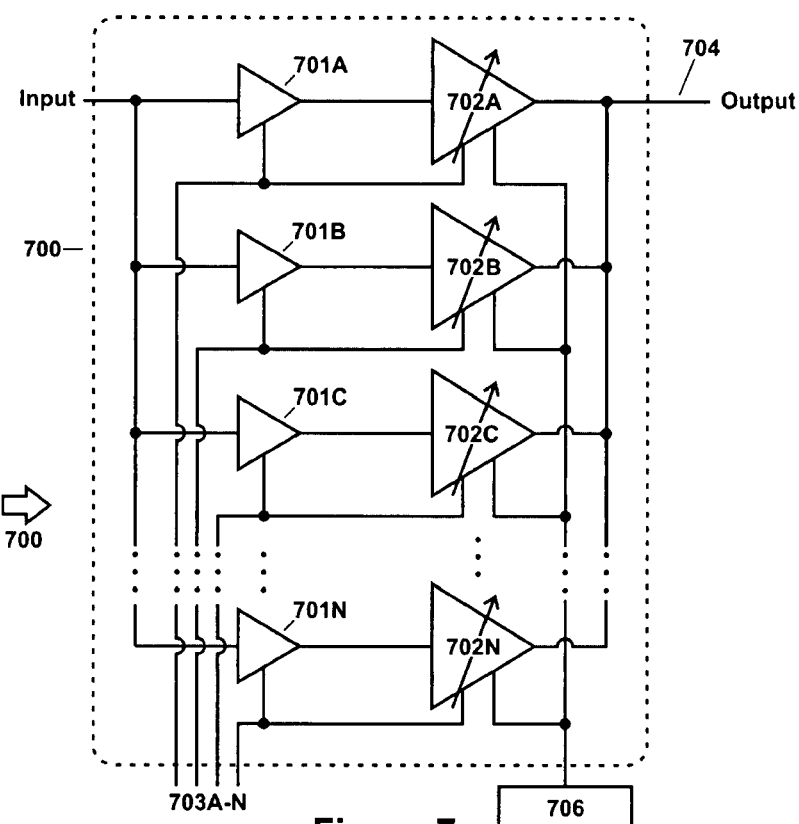
FIG. 7 is a diagram of a power amplifier in accordance with an exemplary embodiment of the present invention.

FIG. 7 is a diagram of power amplifier 700 in accordance with an exemplary embodiment of the present invention. Power amplifier 700 includes a plurality of driver stages 701A through 701N and a plurality of output stages 702A through 702N. Each of driver stages 701A through 701N receives an RF input from which it can drive an output. Each of output stages 702A through 702N receives an output of a driver stage 701A through 701N as an input from which they drive a common output 704. In one exemplary embodiment, the number of driver stages 701A through 701N is the same as the number of output stages 702A through 702N and each driver stage amplifier provides an input signal to a single output stage amplifier. In another exemplary embodiment, driver stages 701A through 701N generate a common output signal which is provided as an input to each of the output stages 702A through 702N.

One or more output stages 702A through 702N and driver stages 701A through 701N can be selectively disabled using selection signals 703A through 703N. Disabling one or more of driver stages 701A through 701N and output stages 702A through 702N reduces power consumption at lower output levels, and also reduces leakage of signals through output stages 702A through 702N caused by capacitive or other coupling between the inputs and outputs of output stages 702A through 702N. Control circuit 706 can be used to adjust the gain of output stages 702A through 702N. In one exemplary embodiment, control circuit 706 can also generate selection signals 703A through 703N, or can combine selection signals 703A through 703N with the amplitude control for output stages 702A through 702N by setting the gain of one or more of output stages 702A through 702N to zero so as to effectively disable the corresponding output stage.

In one exemplary embodiment, each driver stage 701A through 701N and a corresponding output stage 702A through 702N receives a selection signal so that each driver stage 701A through 701N and a corresponding output stage 702A through 702N can be selectively disabled together, so as to simultaneously optimize the performance of driver stages 701A through 701N and output stages 702A through 702N while using a smaller number of selection signals 703A through 703N. Additionally, leakage through common output 704 of output stages 702A through 702N can be greatly reduced since one or more of the inputs of output stages 702A through 702N can be nearly zero amplitude if the associated driver stage 701A through 701N producing the input signal is disabled. Driver stages 701A through 701N and output stages 702A and 702N can be configured in a binary weighted architecture, a logarithmic weighted architecture, linear weighted architecture, or in other suitable architectures.

Figure 8:
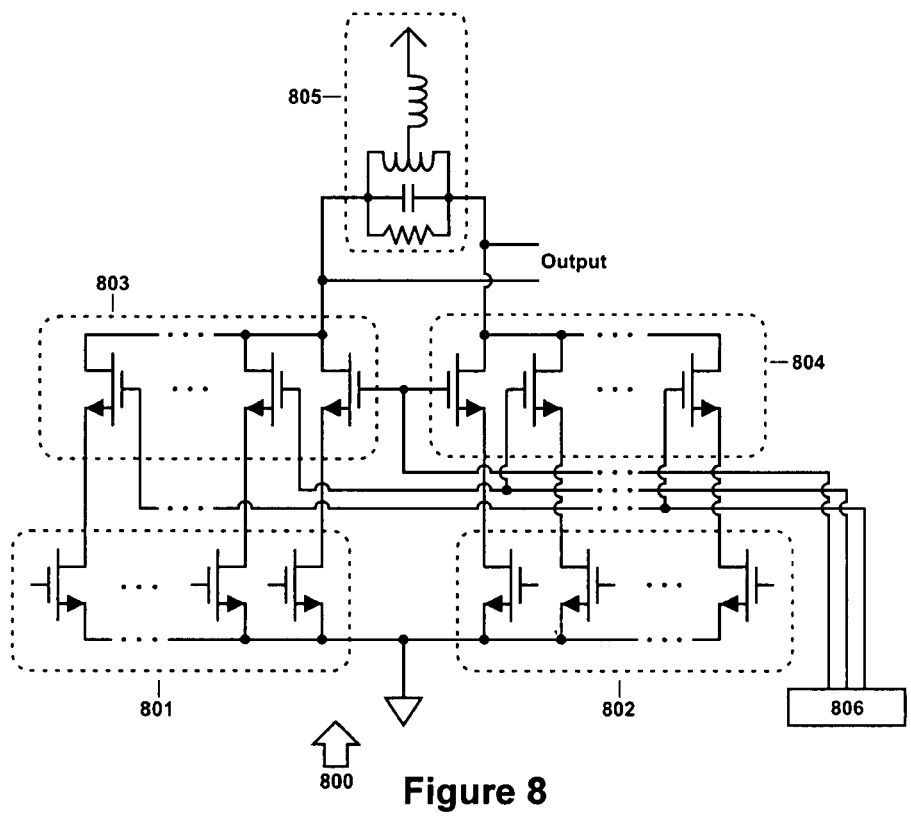
FIG. 8 is a diagram of a power amplifier in accordance with an exemplary embodiment of the present invention.

FIG. 8 is a diagram of power amplifier 800 in accordance with an exemplary embodiment of the present invention. Power amplifier 800 includes switching transistors 801, switching transistors 802, cascode transistors 803, cascode transistors 804, and load network 805. Switching transistors 801 receive an input RF signal in a first polarity at their gates (if field effect transistors (FETs)), bases (if bipolar junction transistors (BJTs)) or other suitable control terminal and are connected to a common point such as ground at their sources (if FETs), emitters (if BJTs), or other suitable conducting terminal. Switching transistors 802 similarly receive an input RF signal in a second polarity at their control terminals and are connected to a common point such as ground at their conducting terminals. A drain (if FET), collector (if BJT), or other suitable second conducting terminal of each switching transistor 801 is connected to a source, emitter or other suitable conducting terminal of a cascode transistor 803, and a drain, collector or other suitable conducting terminal of each switching transistor 802 is connected to a source, emitter or other suitable conducting terminal of a cascode transistor 804. The drains, collectors or other suitable conducting terminals of cascode transistors 803 are connected together and coupled to a first terminal of load network 805 to produce a first polarity of an output. The drains, collectors or other suitable conducting terminals of cascode transistors 804 are connected together and coupled to a second terminal of load network 805 to produce a second polarity of the output. The first and second polarities of the output can be used as a differential output of power amplifier 800. Load network 805 can be a suitable RLC network such as a class E/F load network, a class A or A/B load network, or other suitable load network.

The gates, bases or other suitable control terminals of cascode transistors 803 and 804 are provided with control voltages by control circuit 806. Control circuit 806 can selectively disable one or more of cascode transistors 803 and 804, such as by setting the control voltage of the transistor or transistors to be disabled to a sub-threshold value. The control terminal voltages of those cascode transistors 803 and 804 which are not disabled can be set by control circuit 806 in order to control the output level or gain of power amplifier 800. This can occur by switching transistors 801 and 802 being alternately turned on and off at the RF frequency.

In one exemplary embodiment, switching transistors 801 can be switched on during a first phase and switching transistors 802 can be switched on during a second phase. During the first phase, switching transistors 801 connect the sources, emitters or other conducting terminals of cascode transistors 803 to the common voltage. The current produced by the drain, collectors or other suitable conducting terminals of each cascode transistors 803 can then be related to the gate-source voltage, base-emitter voltage, or other suitable voltage of that cascode transistor and the size of the transistor. For example, for FET transistors, the gate-source voltage can be nearly the same as the gate voltage minus the common voltage due to the connection of their sources to the common voltage through switching transistors 801, and the current can be determined by the difference between the gate voltages and the common voltage. During times not in the first phase, switching transistors 801 can be in an off state, so that the drain current of cascode transistors 803 is blocked.

During the second phase, switching transistors 802 connect the sources, emitters or other conducting terminals of cascode transistors 804 to the common voltage. The current produced by the drain, collectors or other suitable conducting terminals of each cascode transistors 804 can then be related to the gate-source voltage, base-emitter voltage, or other suitable voltage of that cascode transistor and the size or rating of the transistor. For example, for FET transistors, the gate-source voltage can be nearly the same as the gate voltage minus the common voltage due to the connection of their sources to the common voltage through switching transistors 802, and the current can be determined by the difference between the gate voltages and the common voltage. During times not in the first phase, switching transistors 802 can be in an off state, so that the drain current of cascode transistors 803 is blocked.

Control circuit 806 can control the amplitude of the current to the first and second output polarities by both changing the effective device size or rating of cascode transistors 803 and 804 by disabling one or more of the transistors as well as by changing the gate, base or other control terminal voltages of those cascode transistors which are not disabled.

Power amplifier 800 can reduce the leakage power from the RF input to the RF output, such as by disabling one or more of the cascode transistors when producing an output with low amplitude. In one exemplary embodiment, the gates, bases or other control terminals of the disabled cascode transistors of 803 and 804 can be connected with low impedance to ground to further reduce coupling through the disabled cascode transistors 803 and 804. Power amplifier 800 can also allow a wide range of different output amplitudes to be generated with similar gate voltages. By disabling one or more of cascode transistors 803 and 804, the same control voltages on the remaining cascode transistors can produce smaller output amplitudes. This operation can allow relaxation of the output voltage range requirements of control circuit 806, while also allowing small output amplitudes to be generated without using sub-threshold conduction in cascode transistors 803 and 804.

Figure 9:
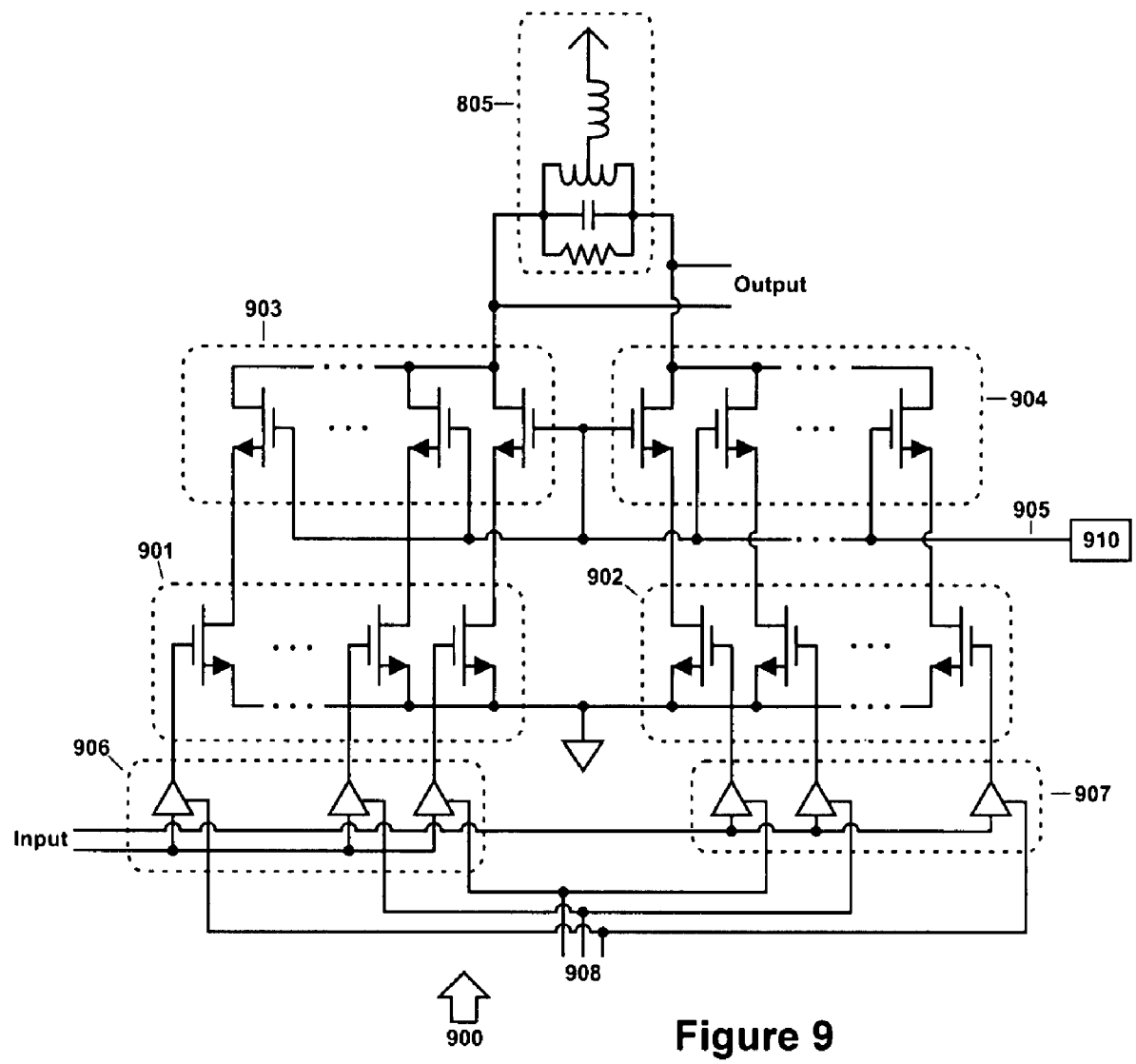
FIG. 9 is a diagram of a power amplifier in accordance with an exemplary embodiment of the present invention.

FIG. 9 is a diagram of power amplifier 900 in accordance with an exemplary embodiment of the present invention. Power amplifier 900 includes a plurality of driver stage amplifiers 906, a plurality of driver stage amplifiers 907, a plurality of switching transistors 901, a plurality of switching transistors 902, a plurality of cascode transistors 903, a plurality of cascode transistors 904 and load network 805.

Driver stage amplifiers 906 each receive a first polarity RF signal at an input and can each produce an output, and driver stage amplifiers 907 each receive a second polarity RF signal at an input and can each produce an output. Switching transistors 901 each receive an output of a driver stage amplifier 906 at a control terminal (e.g. gate or base) and are connected to a common point such as ground at a conducting terminal (e.g. source or emitter). Switching transistors 902 each receive an output of a driver stage amplifier 907 at a control terminal (e.g. gate or base) and are connected to a common point such as ground at a conducting terminal (e.g. source or emitter). A second conducting terminal (e.g. drain or collector) of each switching transistor 901 is connected to a conducting terminal (e.g. source or emitter) of a cascode transistor 903, and a second conducting terminal (e.g. drain or collector) of each switching transistor 902 is connected to a conducting terminal (e.g. source or emitter) of a cascode transistor 904. The second conducting terminals (e.g. drain or collector) of cascode transistors 903 are connected together and coupled to a first terminal of load network 805 to produce a first polarity of an output. The second conducting terminals (e.g. drain or collector) of cascode transistors 904 are connected together and coupled to a second terminal of load network 805 to produce a second polarity of the output. The first and second polarities of the output can be used as a differential output of power amplifier 900. A control terminal (e.g. gate or base) of each cascode transistor 903 and 904 is connected to a common control voltage 905. Optional control circuit 910 can be used to control the output amplitude or gain of power amplifier 900.

One or more of driver stage amplifiers 906 and 907 can be disabled using selection signals 908. In one embodiment, disabled driver stage amplifiers 906 and 907 can produce outputs that result in switching transistors 901 and 902 that are receiving signals from the disabled driver amplifier to operate in a sub-threshold region. This operation allows these switching transistors 901 and 902 to block the conducting terminal (e.g. drain or collector) current of cascode transistors 903 and 904 connected to it, which reduces leakage from the input RF signal to the output through the cascode transistors, and also allow control circuit 910 to produce various output amplitudes from similar control voltages 905. Disabling of one or more of driver stage amplifiers 906 and 907 reduces the current consumption of the disabled driver amplifiers.

In one exemplary embodiment, the number of driver stage amplifiers 906 and 907, the number of switching transistors 901 and 902, and the number of cascode transistors 903 and 904 are the same as each other. In this embodiment, each driver stage amplifier 906 and 907 can provide its output signal to a corresponding switching transistor 901 and 902, and each switching transistor 901 and 902 can be connected to a corresponding cascode transistor 903 and 904. Using this configuration, disabling of any driver stage amplifiers 906 and 907 can result in disabling of an associated switching transistor 901 or 902, and in disabling of an associated cascode transistor 903 or 904. This configuration thus provides a simple disabling configuration of driver amplifiers, switching transistors and cascode transistors while using a simple control scheme and a small number of selection signals 908. Likewise, the outputs of two or more devices in the various stages can be coupled together to form common inputs one or more devices in the next stage, the various devices can be individually disabled, or other suitable configurations can be used.

In view of the above detailed description of the present invention and associated drawings, other modifications and variations are apparent to those skilled in the art. It is also apparent that such other modifications and variations may be effected without departing from the spirit and scope of the present invention.

What is claimed is:

1. A system for amplifying a signal, comprising:
a plurality of driver stages, each having an input, an output, and a disable control, the plurality of driver stages further comprising a first driver stage having a first gain value and a second driver stage having a second gain value that is two or more time the first gain value;
an output stage having an input coupled to the outputs of the plurality of driver stages; and
a plurality of disable control signals, wherein each disable control signal is provided to one of the driver stages so as to controllably enable and disable each of the driver stages.

2. The system of claim 1 wherein the output stage comprises an adjustable gain control.

3. The system of claim 1 wherein a gain of one of the plurality of driver stages is different from a gain of each of the other plurality of driver stages.

4. The system of claim 1 wherein the plurality of driver stages comprises means for generating a plurality of amplified RF outputs.

5. The system of claim 1 wherein the output stage comprises means for receiving a plurality of amplified RF inputs and generating an amplified RF output.

6. The system of claim 1 further comprising a class E/F load coupled to the output stage.

7. A system for amplifying a signal, comprising:
a driver stage having an input and an output;
a plurality of output stages, each having an input coupled to the output of the driver stage, an output, and a disable control; and
a plurality of disable control signals, wherein each disable control signal is provided to one of the output stages so as to controllably enable and disable each of the output stages.

8. The system of claim 7 wherein each of the output stages comprises an adjustable gain control.

9. The system of claim 8 further comprising a controller coupled to the adjustable gain control of each of the output stages, the controller setting the adjustable gain of one of the output stages to a first level and the adjustable gain of one of the other output stages to a second level that is different from the first level.

10. The system of claim 7 wherein the driver stage comprises means for amplifying an RF signal.

11. The system of claim 7 wherein the plurality of output stages comprises means for amplifying an RF signal.

12. A system for amplifying a signal, comprising:
a plurality of driver stages, each having an input, an output, and a disable control;
a plurality of output stages, wherein each of the plurality of output stages is coupled to one of the plurality of driver stages; and
a plurality of disable control signals, wherein each disable control signal is provided to one of the driver stages so as to controllably enable and disable each of the driver stages.

13. The system of claim 12 wherein one or more of the output stages comprise an adjustable gain control.

14. The system of claim 12 wherein a gain of one of the plurality of driver stages is different from a gain of each of the other plurality of driver stages.

15. The system of claim 12 wherein the plurality of driver stages further comprise:
a first driver stage having a first gain value; and
a second driver stage having a second gain value that is two or more time the first gain value.

16. The system of claim 12 wherein one or more of the plurality of output stages has an input, an output and a disable control, wherein the input of the one or more of the plurality of output stages is coupled to the output of one of the plurality of driver stages.

17. The system of claim 12 wherein the output stage further comprises one or more adjustable gain output stages each having an input, an output and a disable control, wherein the input of each of the adjustable gain output stages is coupled to the output of one of the plurality of driver stages.

18. A system for amplifying a signal, comprising:
a plurality of driver stages, each having an input, an output, and a disable control;
a plurality of output stages each having an input, an output and a disable control, wherein the input of each of the plurality of output stages is coupled to the output of one of the plurality of driver stages; and
a plurality of disable control signals, wherein each disable control signal is provided to one of the driver stages so as to controllably enable and disable each of the driver stages.

19. The system of claim 18 wherein one or more of the output stages comprise an adjustable gain control.

20. The system of claim 18 wherein a gain of one of the plurality of driver stages is different from a gain of each of the other plurality of driver stages.

21. The system of claim 18 wherein the plurality of driver stages further comprise:
a first driver stage having a first gain value; and
a second driver stage having a second gain value that is two or more time the first gain value.

22. The system of claim 18 wherein the plurality of output stages further comprise one or more adjustable gain output stages each having an input, an output and a disable control, wherein the input of each of the adjustable gain output stages is coupled to the output of one of the plurality of driver stages.

23. A system for amplifying a signal, comprising:
a plurality of driver stages, each having an input, an output, and a disable control;
a plurality of adjustable gain output stages each having an input, an output and a disable control, wherein the input of each of the plurality of adjustable gain output stages is coupled to the output of one of the plurality of driver stages; and
a plurality of disable control signals, wherein each disable control signal is provided to one of the driver stages so as to controllably enable and disable each of the driver stages.

24. The system of claim 23 wherein a gain of one of the plurality of driver stages is different from a gain of each of the other plurality of driver stages.

25. The system of claim 23 wherein the plurality of driver stages further comprise:
a first driver stage having a first gain value; and
a second driver stage having a second gain value that is two or more time the first gain value.

* * * * *

UNITED STATES PATENT AND TRADEMARK OFFICE
CERTIFICATE OF CORRECTION

| | | |
|---|---|---|
| PATENT NO. | : 7,649,411 B2 | Page 1 of 1 |
| APPLICATION NO. | : 11/827186 | |
| DATED | : January 19, 2010 | |
| INVENTOR(S) | : Ichiro Aoki et al. | |

It is certified that error appears in the above-identified patent and that said Letters Patent is hereby corrected as shown below:

Col. 8, line 56, please change "time" to -- times --;

Col. 9, line 49, please change "time" to -- times --;

Col. 10, line 26, please change "time" to -- times --;

Col. 10, line 52, please change "time" to -- times --.

Signed and Sealed this

Second Day of March, 2010

David J. Kappos
*Director of the United States Patent and Trademark Office*